(12) United States Patent
Sonkoly et al.

(10) Patent No.: US 11,791,341 B2
(45) Date of Patent: Oct. 17, 2023

(54) RADIO-FREQUENCY LOSS REDUCTION FOR INTEGRATED DEVICES

(71) Applicant: OpenLight Photonics, Inc., Goleta, CA (US)

(72) Inventors: John Sonkoly, Laguna Niguel, CA (US); Erik Johan Norberg, Santa Barbara, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 0 days.

(21) Appl. No.: 17/477,092

(22) Filed: Sep. 16, 2021

(65) Prior Publication Data

US 2022/0005832 A1 Jan. 6, 2022

Related U.S. Application Data

(63) Continuation of application No. 16/863,223, filed on Apr. 30, 2020, now Pat. No. 11,164,893.

(51) Int. Cl.
*H01L 27/12* (2006.01)
*H01L 21/84* (2006.01)
*H01L 23/528* (2006.01)

(52) U.S. Cl.
CPC .......... *H01L 27/1203* (2013.01); *H01L 21/84* (2013.01); *H01L 23/528* (2013.01)

(58) Field of Classification Search
CPC ............... H01L 27/1203; H01L 21/084; H01L 23/528; H01L 21/76289; G02F 1/2255
USPC ................................ 257/773; 438/618, 666
See application file for complete search history.

(56) References Cited

U.S. PATENT DOCUMENTS

| | | | |
|---|---|---|---|
| 6,310,387 B1 | 10/2001 | Seefeldt et al. | |
| 11,164,893 B1 | 11/2021 | Sonkoly et al. | |
| 2004/0096143 A1 | 5/2004 | Shpantzer et al. | |
| 2014/0175598 A1 | 6/2014 | Li et al. | |
| 2019/0171084 A1* | 6/2019 | Parker et al. | ..... H01L 27/14625 |
| 2021/0041726 A1* | 2/2021 | Katsuyama | ......... G02F 1/01708 |
| 2021/0343745 A1 | 11/2021 | Sonkoly et al. | |

FOREIGN PATENT DOCUMENTS

| | | |
|---|---|---|
| CN | 113594188 A | 11/2021 |
| EP | 3675162 A1 | 7/2020 |

(Continued)

OTHER PUBLICATIONS

"U.S. Appl. No. 16/863,223, Examiner Interview Summary dated Aug. 3, 2021", 2 pgs.
"U.S. Appl. No. 16/863,223, Non Final Office Action dated May 3, 2021", 10 pgs.

(Continued)

*Primary Examiner* — Thinh T Nguyen
(74) *Attorney, Agent, or Firm* — Schwegman Lundberg & Woessner, P.A.

(57) ABSTRACT

In radio-frequency (RF) devices integrated on semiconductor-on-insulator (e.g., silicon-based) substrates, RF losses may be reduced by increasing the resistivity of the semiconductor device layer in the vicinity of (e.g., underneath and/or in whole or in part surrounding) the metallization structures of the RF device, such as, e.g., transmission lines, contacts, or bonding pads. Increased resistivity can be achieved, e.g., by ion-implantation, or by patterning the device layer to create disconnected semiconductor islands.

12 Claims, 5 Drawing Sheets

(56) References Cited

FOREIGN PATENT DOCUMENTS

SG       10202005148     11/2021
TW         202143390 A   11/2021

OTHER PUBLICATIONS

"U.S. Appl. No. 16/863,223, Notice of Allowance dated Aug. 11, 2021", 8 pgs.
"U.S. Appl. No. 16/863,223, Response filed Feb. 23, 2021 to Restriction Requirement dated Jan. 4, 2021", 7 pgs.
"U.S. Appl. No. 16/863,223, Response filed Aug. 3, 2021 to Non Final Office Action dated May 3, 2021", 8 pgs.
"U.S. Appl. No. 16/863,223, Restriction Requirement dated Jan. 4, 2021", 10 pgs.
"European Application Serial No. 20183269.8, Extended European Search Report dated Mar. 24, 2021", 11 pgs.
"European Application Serial No. 20183269.8, Partial European Search Report dated Dec. 23, 2020", 12 pgs.
Chan, K T, et al., "Low RF loss and noise of transmission lines on Si substrates using an improved ion implantation process", IEEE MTT-S Digest, (2003), 963-966.
Loncar, Marko, et al., "Design and Fabrication of Silicon Photonic Crystal Optical Waveguides", Journal of Lightwave Technology, vol. 18, No. 10, (Oct. 2000), 1402-1411.
Zhang, Xingyu, et al., "Antenna-coupled silicon-organic hybrid integrated photonic crystal modulator for broadband electromagnetic wave detection", Proceedings vol. 9362, Terahertz, RF, Millimeter, and Submillimeter-Wave Technology and Applications VIII; 936200, (Mar. 14, 2015), 20 pgs.

\* cited by examiner

RADIO-FREQUENCY LOSS REDUCTION FOR INTEGRATED DEVICES

PRIORITY

This application is a continuation of U.S. patent application Ser. No. 16/863,223, filed Apr. 30, 2020, which is incorporated by reference herein in its entirety.

TECHNICAL FIELD

This disclosure relates to radio-frequency (RF) loss reduction in RF devices such as, e.g., high-speed photonic devices and interconnects.

BACKGROUND

High-speed silicon photonic devices, such as, for example, optical modulators and photodiodes, include both optical and electronic elements. Many of the optical elements are formed in a silicon device layer on top of a buried oxide (BOX) or other insulating layer. The electrical conductivity of this silicon layer (e.g., the silicon slab that remains in areas surrounding the silicon device structures) can negatively impact the RF performance of the devices due to increased RF losses and additional parasitic elements. While this issue can in some cases be addressed by removing the silicon slab underneath RF metal pads and lines, fabrication considerations and optical device configurations preclude this solution in many instances. For example, in some devices, optical waveguides or other optical structures formed in the silicon layer take up real estate in the vicinity of metal pads and lines, significantly limiting the area from which silicon can be removed. Further, even in device-free regions, silicon removal across substantial areas may not be possible because of its tendency to undermine the structural integrity of the substrate. Accordingly, alternatives to simply removing silicon under metal lines and pads are desirable.

DETAILED DESCRIPTION

Described herein are approaches to reducing RF losses associated with integrated RF devices by increasing the average electrical resistivity (i.e., reducing the average conductivity) of the device layer at least in the vicinity of the metallization structures of the devices (such as metal lines and pads), and in some cases across the entire device layer except in areas defining semiconductor device structures. In some embodiments, increased resistivity is achieved by ion implantation of, e.g., hydrogen (H), helium (He), boron (B), lithium (Li), carbon (C), or other suitable materials. In other embodiments, the device layer is patterned to form disconnected islands separated by non-conductive (e.g., dielectric-filled) channels that serve to interrupt eddy currents induced in the device layer. These islands may decrease in size and increase in density towards the edges of the metallization structures, where eddy currents tend to be strongest.

In the following, RF loss reduction is described, for specificity, with respect to photonic devices implemented in silicon-on-insulator (SOI) substrates. As will be appreciated by those of ordinary skill in the art, however, the disclosed RF loss reduction approaches are not limited to photonic devices, but are equally applicable to any RF devices implemented in a semiconductor-on-insulator substrate, including RF electronic devices and sensors. Further, although the integrated devices are commonly implemented on SOI substrates, semiconductor materials other than silicon (e.g., germanium, indium phosphide, gallium arsenide, etc.) may also be used for the device layer and device structures (such as waveguides) formed therein.

Figure 1:
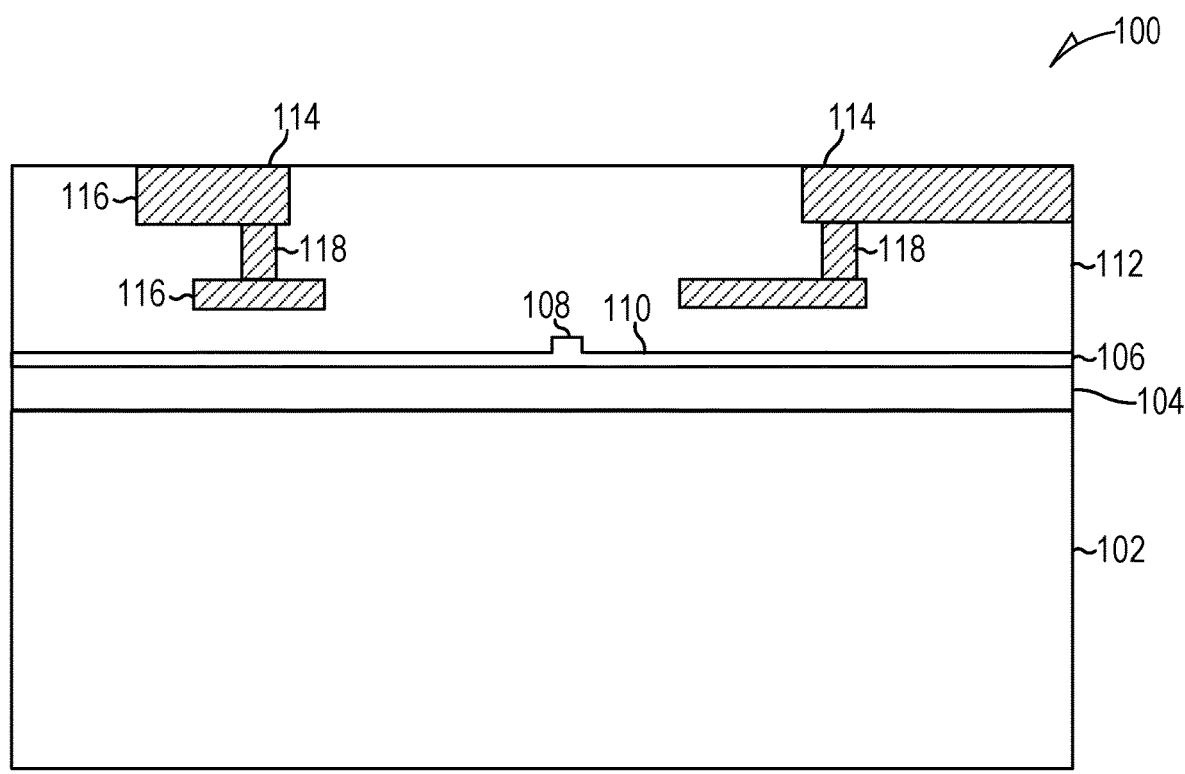
FIG. 1 is a schematic cross-sectional view of an example RF photonic structure including optical and electronic elements, in accordance with various embodiments.

FIG. 1 illustrates, in a schematic cross-sectional view, an example RF photonic structure 100 in accordance with various embodiments. The structure 100 includes optical and electronic device components formed on an SOI substrate that includes a handle layer 102 (made e.g., of silicon, diamond, or another suitable material) and, separated from the handle layer 102 by a buried oxide (BOX) or other dielectric layer (herein also generically "insulating layer") 104, a silicon device layer 106. A silicon waveguide and/or other silicon device structure 108 may be formed in the silicon device layer 106. As shown, the silicon device structure 108 may result from a partial etch of the silicon device layer 106 that leaves a silicon slab 110 of smaller thickness than the original silicon device layer 106 across portions of the substrate. Alternatively, the contours of the silicon device structure 108 may be defined by channels etched into the silicon device layer 106 down to the insulating layer 104. The RF photonic structure 100 may also include, alternatively or additionally to any silicon device structure(s) 108 in the silicon device layer, other semiconductor device structures (not shown), e.g., made of III-V or other compound semiconductor materials, disposed above the silicon device layer 106. For instance, many laser diodes, photodiodes, optical amplifiers, and optical modulators include active device layers, or p-i-n layered structures, made of III-V material. The silicon device layer 106, along with any semiconductor device structures formed in or on the silicon device layer 106, may be covered in a top cladding layer 112, of, e.g., an oxide or other dielectric. To enable application or read-out of an RF signal, the RF photonic structure 100 includes one or more metallization structures 114 embedded in (or alternatively disposed on) the top cladding layer 112. As shown, the metallization structures 114 may include metal layers 116 at multiple levels above the silicon device layer 106, connected by vertical metal vias 118.

Figure 2:
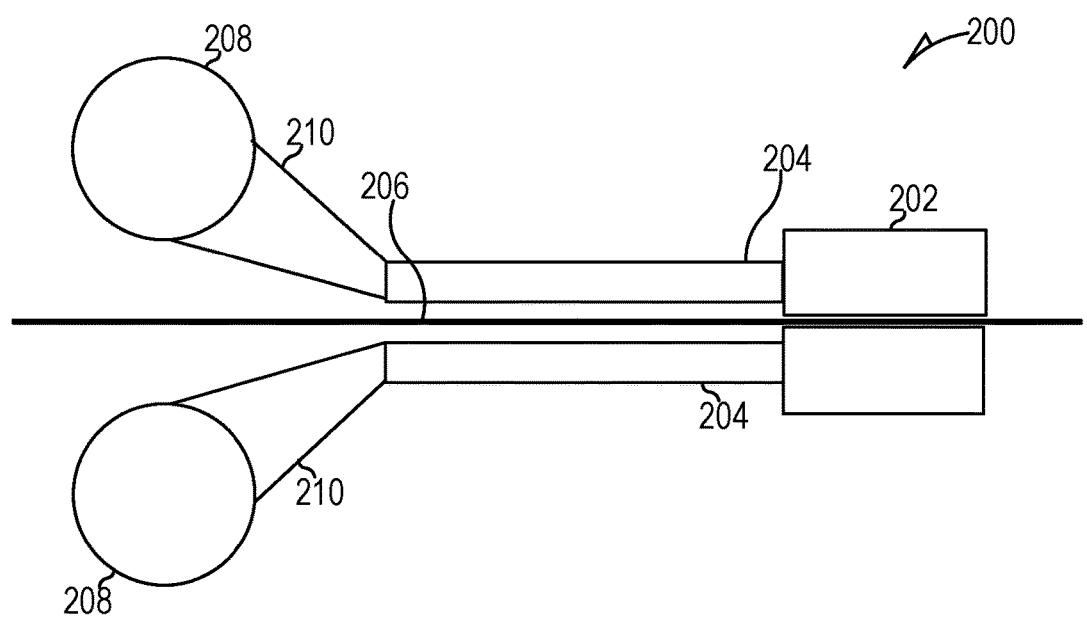
FIG. 2 is a schematic top view of an example RF photonic structure including optical and electronic elements, in accordance with various embodiments.

FIG. 2 provides a schematic top view of an example RF photonic structure 200 in accordance with various embodiments (such as, e.g., the structure 100 of FIG. 1), further illustrating various types of metallization structures (e.g., 114). As shown, the metallization structures may include, as one type, device metallization 202, that is, metal disposed directly on one or more semiconductor device structures of the RF photonic device. Another type of metallization structure is a transmission line, which includes a pair of electrodes 204 connected to the two terminals of an RF voltage source. The electrodes 204 may run, for at least a portion of their length, along a semiconductor device formed in or on the silicon device layer, e.g., as shown, along both sides of a waveguide 206. Further, the RF photonic structure 200 generally includes metal bonding pads 208 for bonding wire leads to the photonic chip, as well as general metal lines or traces 210 that can make electrical connections between metallization structures within a device, or run across the chip to form interconnects between multiple devices or between a device and the bonding pads (e.g., as shown, between the transmission line electrodes 204 and the bonding pads 208).

Figure 3:
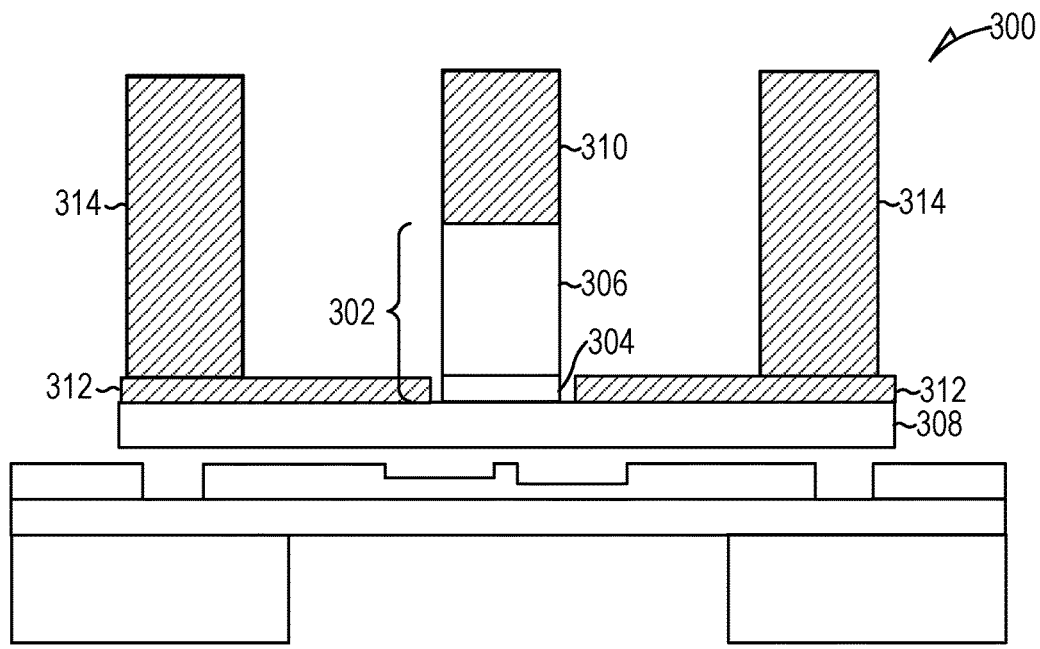
FIG. 3 is a schematic cross-sectional view of an example p-i-n diode structure, illustrating device metallization in accordance with one embodiment.

FIG. 3 shows, as an example of an RF photonic structure with device metallization, a p-i-n diode structure 300, as can be used in RF photonic devices such as laser diodes, photodiodes, or electro-absorption modulators. As shown in a cross-sectional view, the p-i-n diode may take the form of a layered structure with a narrower mesa 302 including the intrinsic and p-type layers 304, 306 stacked on top of a wider strip of n-type material 308. To establish electrical connections with the p-type and n-type layers 306, 308 of the diode, a p-side metal contact via 310 may be disposed across the top p-type layer 306, and n-side metal layers 312 may be disposed on the n-type layer 308 to both sides of the mesa 302, with vertical contact vias 314, in turn, extending from the n-side metal layers 312. The contact vias 310, 314 may extend to the top of the top cladding layer, where they may connect, directly or via metal lines, to metal bonding pads (not shown) constituting the electrical terminals of the photonic chip.

Figure 4A:
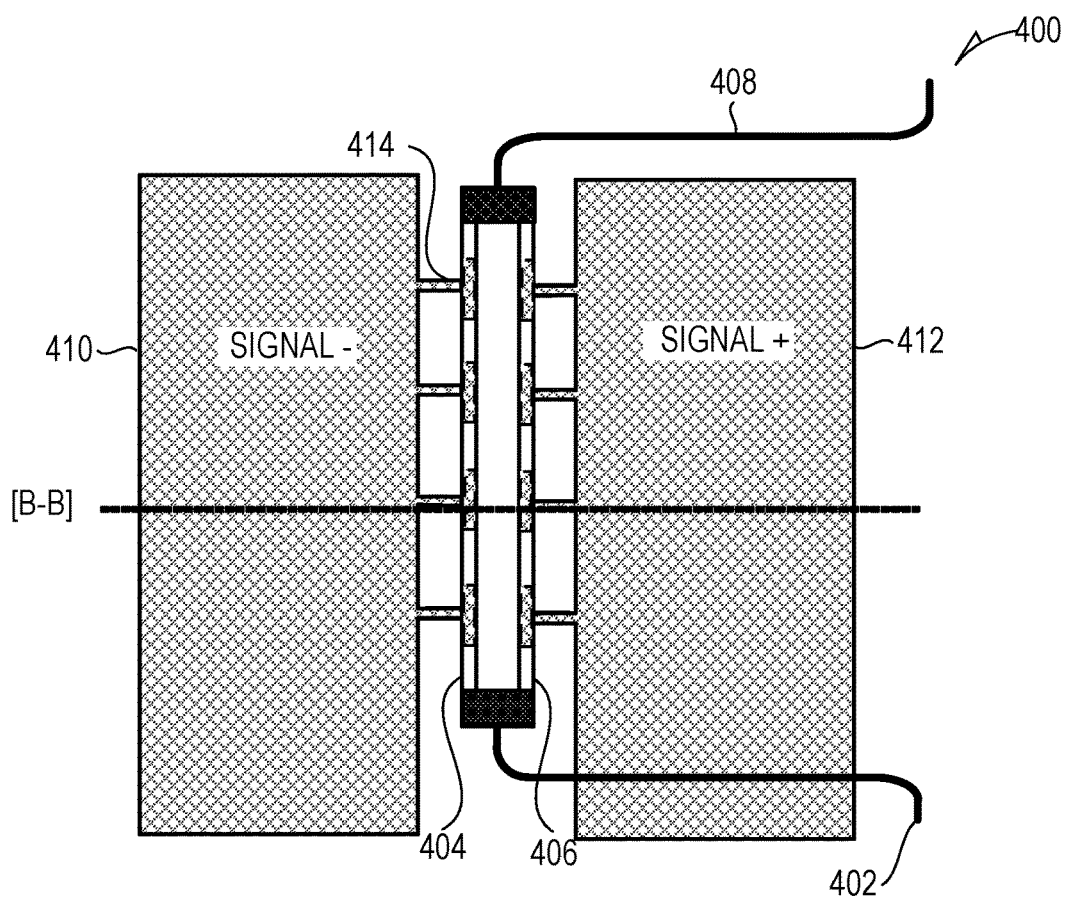
FIGS. 4A and 4B are schematic top and a cross-sectional views, respectively, of an example Mach-Zehnder modulator, illustrating a transmission line in accordance with one embodiment.
Figure 4B:
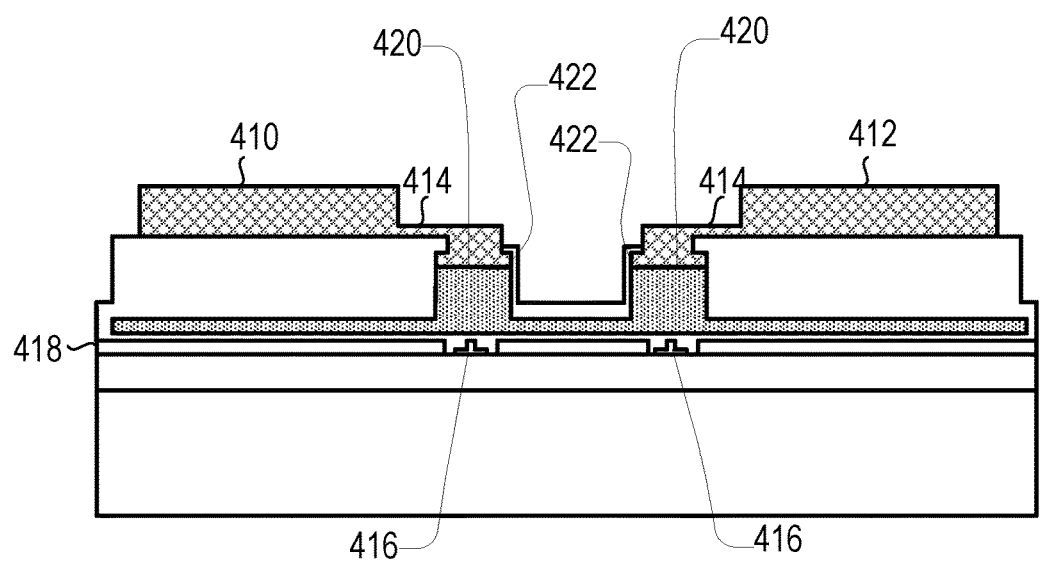

FIGS. 4A and 4B show, as an example of an RF photonic structure including a transmission line, a waveguide-based Mach-Zehnder modulator 400. As FIG. 4A shows in a top view, the Mach-Zehnder modulator 400 includes an incoming waveguide 402 that bifurcates into two interferometric waveguide arms 404, 406, which are then recombined into an outgoing waveguide 408. Electrodes 410, 412 of opposite polarity are disposed to both sides of the interferometric waveguide arms 404, 406, and are each connected to one of the interferometric waveguide arms 404, 406 via contact traces 414. An RF signal applied between these electrodes 410, 412 can be used to electrooptically modulate the relative optical phase between light propagating along the two waveguide arms 404, 406, thereby modulating the optical signal amplitude in the outgoing waveguide 408. As shown in cross-sectional view in FIG. 4B, each interferometer arm 404, 406 may be implemented as a composite waveguide including a silicon rib waveguide 416 formed in the silicon device layer 418 and, disposed above the rib waveguide 416, a III-V waveguide 420. The contact traces 414 may connect to device metallization 422 on the III-V waveguides 420.

In RF photonic devices, the desired electrooptic modulation of the optical properties of the semiconductor device structures, such as the refractive index of a waveguide or the absorption edge of an intrinsic diode layer, is generally accompanied by undesirable, parasitic electrical currents, including eddy currents induced in the silicon device layer by the varying magnetic field of the RF signal. These parasitic currents give rise to energy losses, which reduce the device performance, e.g., by lowering the modulation amplitude of an optical modulator, the signal strength of a photodiode, etc. In accordance with various embodiments, RF losses are reduced, and the RF performance of the device is accordingly increased, by modifying the silicon device layer to reduce its conductivity and, thus, the parasitic currents.

Figure 5:
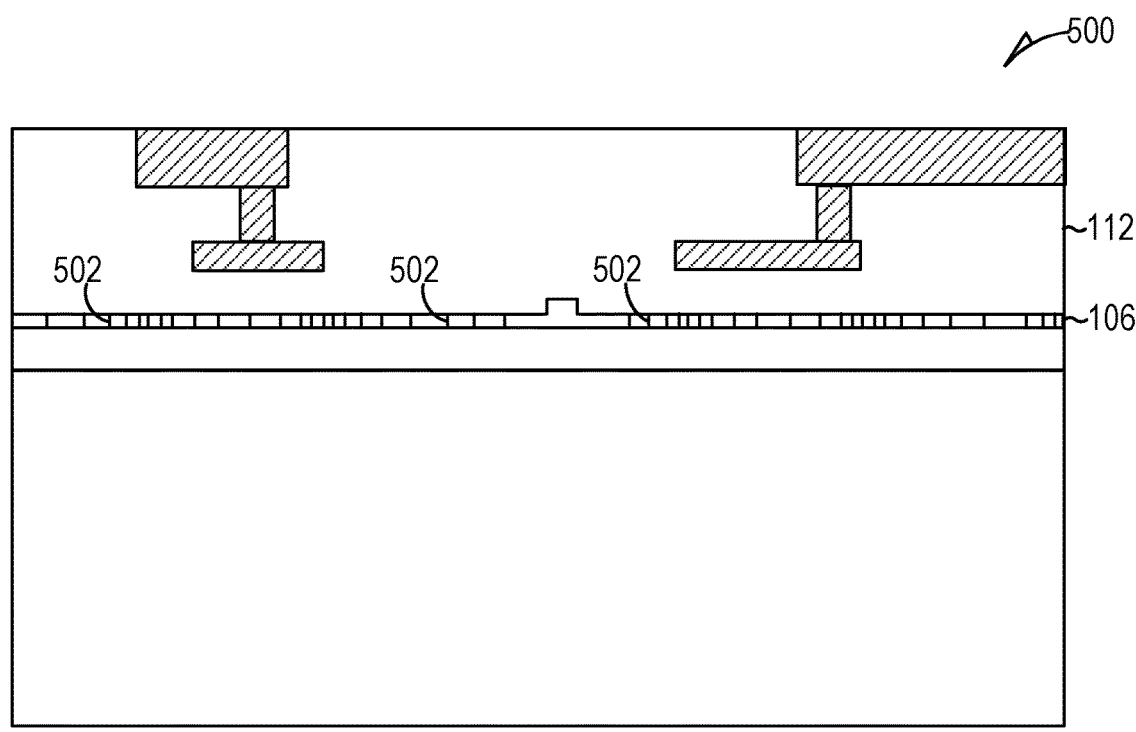
FIG. 5 is a schematic cross-sectional view of an example RF photonic structure as depicted in FIG. 1, illustrating patterning of the silicon device layer in accordance with various embodiments.

FIG. 5 is a schematic cross-sectional view of an example RF photonic structure 500, otherwise as depicted in FIG. 1, in which the silicon (or other semiconductor) device layer 106 is patterned with current-interrupting insulating channels 502 (depicted as vertical lines, only a few being labeled), in accordance with various embodiments. These channels 502 may be etched into the silicon device layer 106 and have a width, depending on process details, in the range between 0.5 μm and 2 μm, e.g., about 1 μm. The channels 502 may be filled with a dielectric material, e.g., as a result of the deposition of the top cladding layer 112 on top of the patterned silicon device layer 106. As shown in top views in FIGS. 6 and 7, the channels may be oriented in multiple directions (in a plane of the silicon device layer 106) so as to intersect with or meet one another and, as a result, form a two-dimensional grid or network of channels that leaves disconnected regions of silicon, herein "silicon islands" (or, more broadly, "semiconductor islands") in between the channels. In some embodiments, the silicon islands have dimensions in the range between about 1 μm and about 50 μm, or in the narrower range between about 4 μm and about 20 μm. By "cutting up" the silicon device layer 106 in this manner, eddy currents across the silicon device layer 106 are interrupted, and large-scale current loops are, thus, avoided. With reference again to FIG. 5, the channels 502 preferably extend throughout the silicon device layer 106 all the way down to the insulating (e.g., BOX) layer 104, such that the silicon islands are electrically isolated from one another, eliminating current flow between islands and confining eddy currents to the much smaller region within each island. However, even partially etched channels will tend to reduce overall eddy current flows across the silicon device layer 106.

Figure 6:
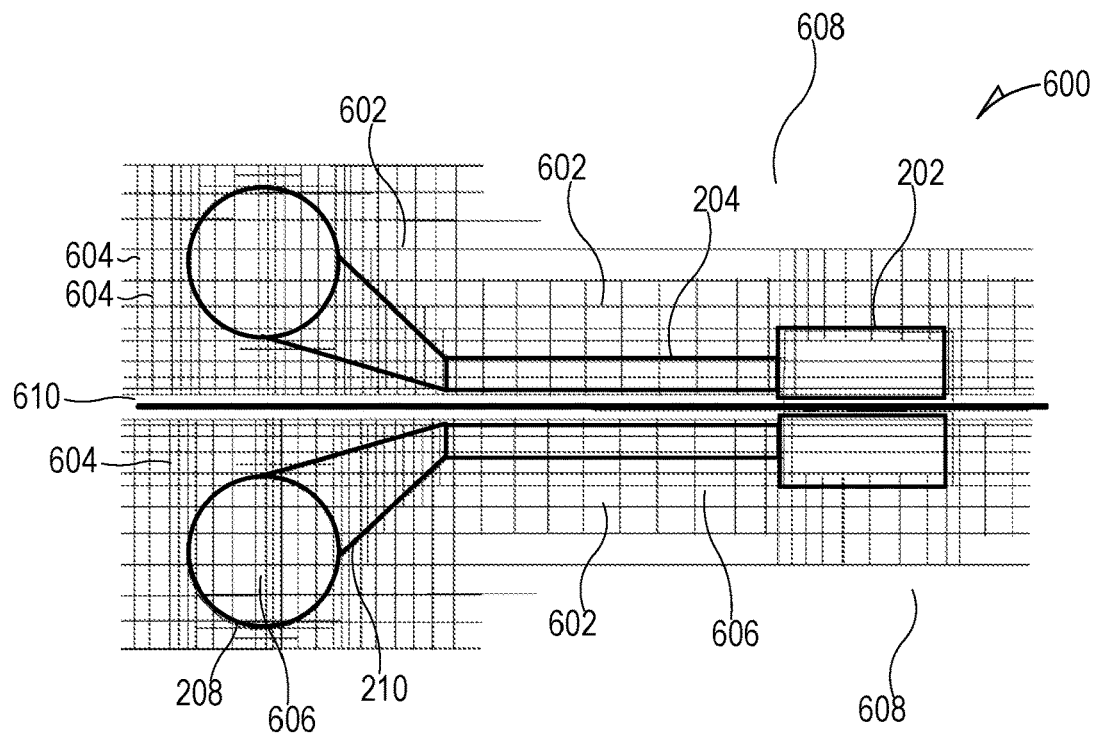
FIG. 6 is a schematic top view of an example RF photonic structure in accordance with one embodiment, illustrating a rectangular grid channel pattern in the silicon device layer relative to locations of the optical and electronic elements of FIG. 2.

FIG. 6 is a schematic top view of an example RF photonic structure 600 in accordance with one embodiment, illustrating a rectangular grid channel pattern in the silicon device layer relative to the locations of the metallization structures 202, 204, 208, 210 and waveguide 206 of FIG. 2. In this example, the silicon device layer includes two sets of parallel, straight channels 602, 604 (only a few channels of each set being labeled), the two sets intersecting one another to form a quadrilateral grid. More specifically, in the example shown, the channels 602 of one set are oriented parallel to the waveguide 206, and the channels 604 of the other set are oriented perpendicular to the waveguide 206, such that the channels 602, 604 form a rectangular grid with rectangular silicon islands 606 (only a few being labeled). The channels 602, 604 need not intersect at right angles, however, and may instead define parallelogram-shaped silicon islands. Further, a third set of parallel channels may intersect the first and second sets at their intersection points to form a triangular grid. Additional configurations of grid lines may occur to those of ordinary skill in the art.

As shown in FIG. 6, the grid formed by the intersecting channels 602, 604 need not be uniform, but spacings between channels may vary, resulting in silicon islands 606 of varying size across the silicon device layer. The channels 602, 604 may be particularly densely spaced, and form the smallest silicon islands 606, in regions directly below the metallization structures 202, 204, 208, 210, or the immediately surrounding regions. Towards greater distances from the metallization structures 202, 204, 208, 210, the spacings between adjacent channels 602, 604 may increase, or channels may even disappear altogether, as generally indicated for the regions 608 away from bonding pads, transmission lines, and device metallization. This decreasing channel density with increasing distance from the metallization structures reflects that the induced eddy currents are, at greater distances, lower in magnitude in the first place. Further, even near metallization structures, channels may be omitted from regions of the silicon device layer that define silicon device structures or include other (e.g., III-V) semiconductor device structures disposed above the silicon, to avoid interfering with the device function. For example, FIG. 6 shows a strip 610 surrounding the waveguide 206 in which the silicon slab remains free of channels.

Figure 7:
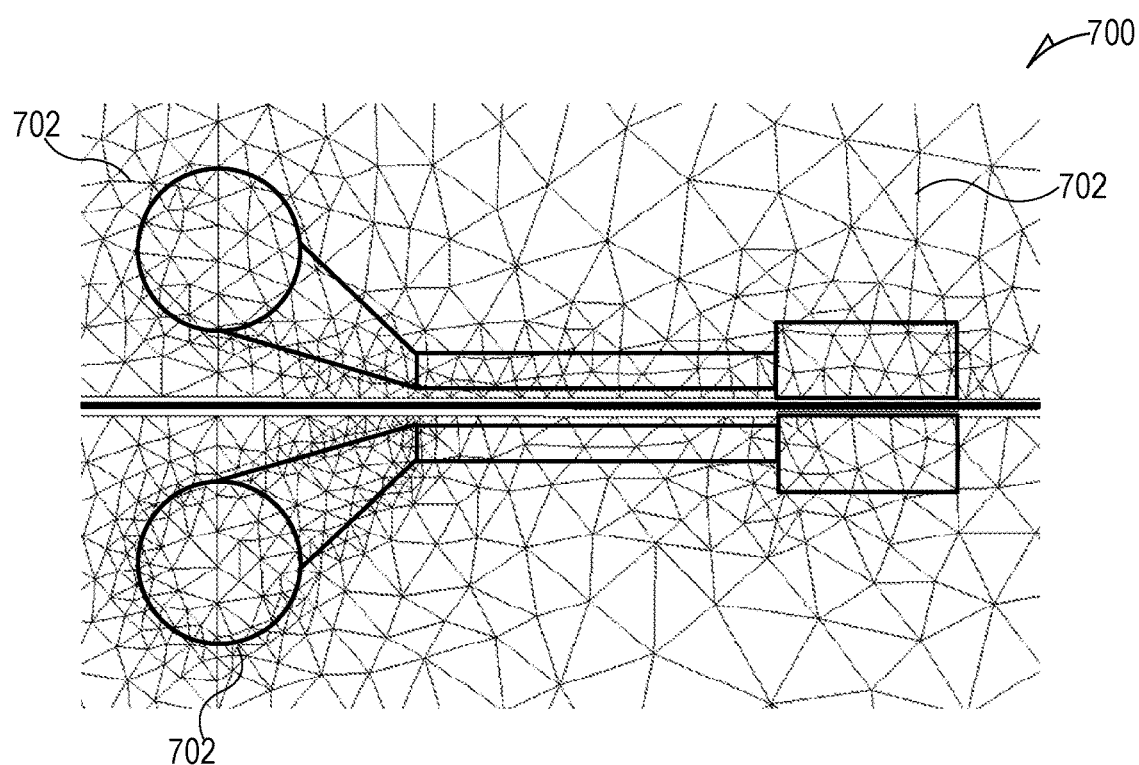
FIG. 7 is a schematic top view of an example RF photonic structure in accordance with one embodiment, illustrating a triangulation channel pattern in the silicon device layer relative to locations of the optical and electronic elements of FIG. 2.

FIG. 7 is a schematic top view of an example RF photonic structure 700 in accordance with one embodiment, illustrating a triangulation channel patterning in the silicon device layer relative to the locations of the metallization structures 202, 204, 208, 210 and waveguide 206 of FIG. 2. In this example, the channels 702 form short segments at various orientations, meeting in groups of three or more channels at the vertices of a channel network that triangulates the arear of the silicon device layer. Similarly to the RF photonic structure 600 with a rectangular grid channel pattern, the channel density may be higher, and the silicon islands correspondingly smaller, in the vicinity of the metallization structures. In some embodiment, the islands may be smallest in regions underneath the edges of a metallization structure, as most clearly shown in FIG. 7 for the metal bonding pads 208 and associated contact traces 210. The waveguide 206 is, just as in FIG. 6, flanked on both sides by a strip of non-patterned, channel-free silicon.

The two channel patterns depicted in FIGS. 6 and 7 are, of course, merely examples, and other channel configurations that dissect the silicon device layer into a plurality of disconnected silicon islands will occur to those of ordinary skill in the art. In general, the silicon islands are located, or concentrated in number and density, in regions where the RF currents are strongest and where the insulating channels, therefore, achieve the greatest performance improvements. These regions generally include the portions of the silicon device layer underneath and/or (laterally) surrounding, in whole or in part, the metallization structures, and especially the regions along edges of the metallization structures. It may not always be possible to fully surround a metallization structure because of nearby semiconductor device components. For example, a silicon waveguide in the region between the electrodes of a transmission line may preclude patterning the area underneath or between the inner edges of the electrodes, but, in this case, patterning underneath and around the outer edges of the electrodes can still effect a significant reduction in RF losses.

Patterning of the silicon device layer with electrically insulating channels that define disconnected silicon islands, as shown in FIGS. 5-7, can interrupt the free flow of RF-induced eddy currents and, as such, reduce the average electrical conductivity of the silicon device layer. Beneficially, this conductivity reduction (or resistivity increase) is achieved by removal of only a small fraction (e.g., less than 10% in some embodiments) of the silicon material in the silicon device layer, maintaining much of the structural support provided by this layer. Limiting material removal to a small fraction can also serve, in some cases, to satisfy layer density balance requirements imposed by the fabrication process.

An alternative approach to increasing the electrical resistivity of the silicon device layer (in regions underneath and/or fully or partially surrounding the metallization structures) is by ion implantation. In this process, ions of a suitable material, such as, e.g., H, He, B, Li, or C are accelerated towards and into the SOI substrate (generally prior to any patterning of the silicon device layer), with ion implantation parameters chosen to cause a reduction of the conductivity of the silicon device layer. In general, ion implantation can lead to crystalline defects in the silicon lattice that are electrically active, and can increase the resistivity of the silicon layer. In some embodiments, a resistivity increase by two to three orders of magnitude is achieved. Ion implantation parameters that can be adjusted to achieve the desired resistivity increase include, in addition to the type of ions, the ion energy (as they are impending on the substrate), the ion dosage, and various annealing parameters (e.g., annealing duration, temperature, temperature slope, and ambient gas). Suitable combinations of ion implantation parameters are known to those of ordinary skill in the art. To provide just one example, hydrogen ion implantation may use 100 KeV H$^+$ ions at a dose between $10^{14}$ and $2\sim10^{16}$ ions per cm$^2$, and the H$^+$ implantation may be followed by thermal annealing in two stages: rapid thermal annealing (e.g., over a period of about one minute, with a steep temperature slope of about 50° C./s and a plateau of about 900° C.), and thereafter conventional thermal annealing (e.g., for a duration in a range between several minutes and two hours, at a temperature of about 1200° C.). When ion implantation is used, in accordance with various embodiments, to increase the resistivity of the silicon layer, the layer areas that have functional roles (e.g., include semiconductor device structures) are generally masked prior to implantation.

Figure 8:
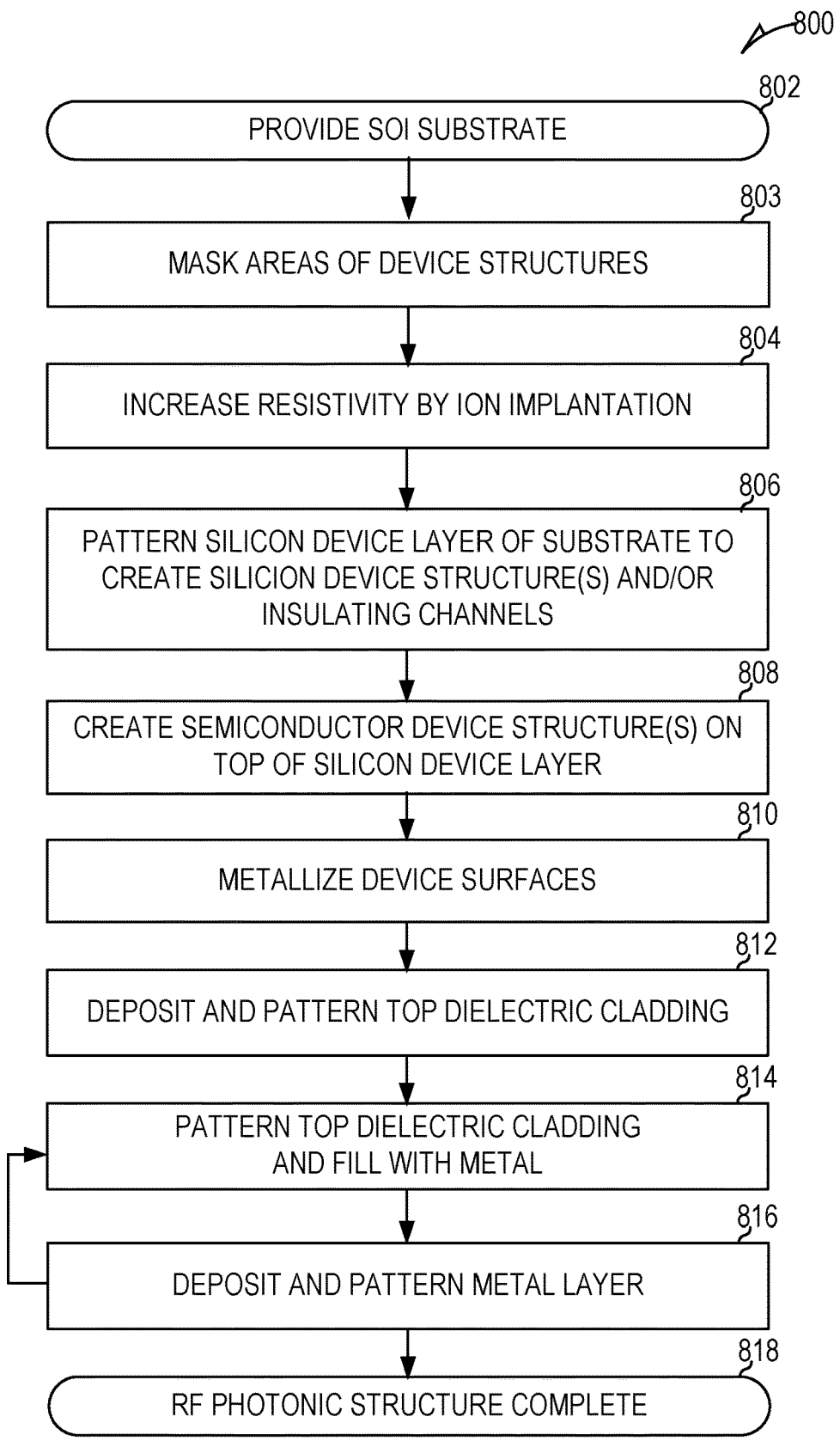
FIG. 8 is a flow chart of a method of manufacturing RF photonic structures in accordance with various embodiments.

FIG. 8 is a flow chart of a method 800 of manufacturing RF photonic structures that, in accordance with various embodiments, incorporates steps for increasing the resistivity of the silicon device layer at least near metallization structures. The method 800 begins with providing, at step 802, a (plain) SOI substrate (or, more generally, semiconductor-on-insulator substrate). In some embodiments, the electrical resistivity of the silicon (or other semiconductor) device layer is increased by ion implantation. In this case, a masking layer is first deposited on the silicon device layer and patterned to mask at least areas of the device layer where sensitive structures, such as semiconductor device structures, will be placed (803). The exposed areas of the silicon device, including, in particular, regions where the metallization structures will be located, are then treated by ion implantation to increase resistivity (804). The silicon device layer is then photolithographically patterned and etched (herein collectively "patterned"), in one or more steps, to form silicon device structures and/or insulating channels that dissect regions outside the device structure(s) and near locations where metallization structures are to be placed into a plurality of disconnected silicon islands (806). (In the case of a substrate with resistivity-increasing ions implanted in the silicon device layer, creating the insulating channels is optional.) Depending on the particular structure and etch depths of the silicon device structure(s), these structures (or portions thereof) and the insulating channels may be created simultaneously or in separate steps. For example, a ridge waveguide, whose sidewalls extend all the way down to the insulating layer of the substrate, can be defined and etched in the same step as the insulating channels. A rib waveguide, which extends from an underling slab of silicon, on the other hand, may be created by a partial etch of the silicon device layer before the remaining silicon slab is photolithographically patterned and fully etched to form the insulating channels.

Following patterning of the silicon device layer, additional semiconductor device structures may be created on top of the silicon device layer (808). For instance, in some embodiments, a layer of another semiconductor material (e.g., silicon nitride) is deposited and patterned to form additional device structures (e.g., silicon nitride waveguides). In other embodiments, compound semiconductor (e.g., III-V) die are bonded to the silicon device layer and then patterned, e.g., to form mesa structures. In some embodiments, surfaces of some of the semiconductor device structures are metallized, e.g., to form electrical contact layers (810). A top dielectric cladding may then be disposed over the substrate and semiconductor device structures (812). Metallization structures may be created in and on the top dielectric cladding by photolithographically patterning and etching the cladding to form via holes, which are thereafter filled with metal to form vertical metal vias (814), and/or by depositing and patterning metal layers to create horizontal metal structures (816). Deposition and patterning of dielectric and metal layers may be repeated alternatingly to form metallization structures at multiple levels (including, e.g., metal bonding pads at the top), with metal vias vertically connecting the different levels. The method 800 ends with a completed RF photonic structure (at 818) within a PIC, ready for integration and packaging with electronic circuit chips.

Having described general approaches to RF loss reduction in integrated devices with reference to the accompanying drawings, the following numbered list describes various example embodiments.

1. A radio-frequency (RF) structure comprising: a substrate comprising a semiconductor device layer disposed on an insulating layer; formed in or on the semiconductor device layer, a semiconductor device structure of an integrated RF device; and disposed above the semiconductor device layer, at least one metallization structure to carry an RF signal to or from the integrated RF device, wherein the semiconductor device layer is patterned to form a plurality of disconnected semiconductor islands, the disconnected semiconductor islands extending at least over a region that at least partially surrounds the at least one metallization structure.

2. The RF structure of example 1, wherein the disconnected semiconductor islands extend at least over a region that fully surrounds the at least one metallization structure.

3. The RF structure of example 1 or example 2, wherein the disconnected semiconductor islands extend over the semiconductor device layer except in regions including and immediately surrounding the semiconductor device structure.

4. The RF structure of any of examples 1-3, wherein the plurality of disconnected semiconductor islands are formed between channels etched into the semiconductor device layer.

5. The RF structure of example 4, wherein the channels form a rectangular grid.

6. The RF structure of example 4, wherein the channels triangulate the patterned region.

7. The RF structure of any of examples 4-6, wherein the channels have a width of between 0.5 µm and 2 µm.

8. The RF structure of any of examples 1-7, wherein the disconnected islands are non-uniform in size, increasing in size with greater distance from an edge of the at least one metallization structure.

9. The RF structure of any of examples 1-8, wherein the semiconductor islands have dimensions of between about 1 µm and about 50 µm.

10. The RF structure of any of examples 1-9, wherein the at least one metallization structure comprises at least one of device metallization, electrodes, contact traces, or bonding pads.

11. The RF structure of any of examples 1-10, wherein the semiconductor device structure comprises at least one of a semiconductor device structure formed in the semiconductor device layer or a semiconductor device structure disposed above the semiconductor device layer.

12. The RF structure of any of examples 1-11, wherein the integrated RF device is a photonic device.

13. The RF structure of any of examples 1-12, wherein the integrated RF device comprises at least one of a laser diode, an optical modulator, a photodetector, or an optical switch.

14. A method of manufacturing a radio-frequency (RF) structure, the method comprising: patterning and etching a semiconductor device layer of a semiconductor-on-insulator substrate to create a plurality of disconnected semiconductor islands in the semiconductor device layer; forming, in or on the semiconductor device layer, a semiconductor device structure of an integrated RF device; and disposing at least one metallization structure above the semiconductor device layer, the at least one metallization structure operably to carry an RF signal to or from the integrated RF device, wherein the semiconductor islands are formed at least over a region that at least partially surrounds the at least one metallization structure.

15. The method of example 14, wherein the semiconductor device structure comprises a semiconductor device structure formed in the semiconductor device layer, simultaneously with the disconnected semiconductor islands, by patterning and etching.

16. A radio-frequency (RF) structure comprising: a substrate comprising a semiconductor device layer disposed on an insulating layer; formed in or on the semiconductor device layer, a semiconductor device structure of an integrated RF device; and disposed above the semiconductor device layer, at least one metallization structure to carry an RF signal to or from the integrated RF device, wherein the semiconductor device layer, at least over a region that at least partially surrounds the at least one metallization structure, comprises implanted ions that increase an electrical resistivity of the semiconductor device layer.

17. The RF structure of example 16, wherein the implanted ions comprise at least one of hydrogen, helium, boron, lithium, or carbon.

18. The RF structure of example 16 or example 17, wherein the metallization structure comprises at least one of device metallization, electrodes, contact traces, or bonding pads.

19. The RF structure of any of examples 16-18, wherein the semiconductor device structure comprises at least one of a semiconductor device structure formed in the semiconductor device layer or a semiconductor device structure disposed above the semiconductor device layer.

20. The RF structure of any of examples 16-19, wherein the integrated RF device is a photonic device.

21. The RF structure of any of examples 16-20, wherein the integrated RF device comprises at least one of a laser diode, an optical modulator, a photodetector, or an optical switch.

22. A method of manufacturing a radio-frequency (RF) structure, the method comprising: increasing an electrical resistivity of a portion of a semiconductor device layer of a semiconductor-on-insulator substrate by ion implantation; forming, in or on the semiconductor device layer, a semiconductor device structure of an RF device; and disposing at least one metallization structure above the semiconductor device layer, the at least one metallization structure operably to carry an RF signal to or from the RF photonic device, wherein the portion of the semiconductor device layer extend over a region that at least partially surrounds the at least one metallization structure.

23. The method of example 22, further comprising, prior to the ion implantation: masking the semiconductor device layer at least in a region including the semiconductor device structure.

24. The structure of any of examples 1-13 or 16-21, wherein the semiconductor device layer is a silicon layer.

25. The method of any of examples 14, 15, 22, or 23 wherein the semiconductor device layer is a silicon layer.

Although the inventive subject matter has been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense.

What is claimed is:

1. A radio-frequency (RF) structure comprising:
   a substrate comprising a semiconductor device layer disposed on an insulating layer;
   formed in or on the semiconductor device layer, a semiconductor device structure of an integrated RF device; and
   disposed above the semiconductor device layer, at least one metallization structure to carry an RF signal to or from the integrated RF device,
   wherein the semiconductor device layer, at least over a region that at least partially surrounds the at least one metallization structure, but not in any region in which the semiconductor device structure is formed, comprises implanted ions that increase an electrical resistivity of the semiconductor device layer.

2. The RF structure of claim 1, wherein the implanted ions comprise at least one of hydrogen, helium, boron, lithium, or carbon.

3. The RF structure of claim 1, wherein the metallization structure comprises at least one of device metallization, electrodes, contact traces, or bonding pads.

4. The RF structure of claim 1, wherein the semiconductor device structure comprises at least one of a semiconductor device structure formed in the semiconductor device layer or a semiconductor device structure disposed above the semiconductor device layer.

5. The RF structure of claim 1, wherein the integrated RF device is a photonic device.

6. The RF structure of claim 1, wherein the integrated RF device comprises at least one of a laser diode, an optical modulator, a photodetector, or an optical switch.

7. The RF structure of claim 1, wherein the semiconductor device layer comprises silicon.

8. The RF structure of claim 7, wherein the semiconductor device structure comprises a silicon device structure formed in the semiconductor device layer.

9. The RF structure of claim 1, wherein the semiconductor device structure comprises a structure of III-V material disposed above the semiconductor device layer.

10. The RF structure of claim 1, further comprising a top cladding disposed on top of the semiconductor device layer and cover the semiconductor device structure, the at least one metallization structure being disposed on or embedded in the top cladding.

11. The RF structure of claim 1, wherein the semiconductor device layer comprises implanted ions that increase the electrical resistivity of the semiconductor device layer over a region that fully surrounds the at least one metallization structure.

12. The RF structure of claim 1, wherein the implanted ions increase the electrical resistivity of the semiconductor device layer in the region that at least partially surrounds the at least one metallization structure by at least two orders of magnitude.

* * * * *